United States Patent [19]
Haigh et al.

[11] Patent Number: 6,054,780
[45] Date of Patent: Apr. 25, 2000

[54] MAGNETICALLY COUPLED SIGNAL ISOLATOR USING A FARADAY SHIELDED MR OR GMR RECEIVING ELEMENT

[75] Inventors: Geoffrey T. Haigh, Boxford; Paul R. Nickson, Topsfield, both of Mass.

[73] Assignee: Analog Devices, Inc., Norwood, Mass.

[21] Appl. No.: 09/118,032

[22] Filed: Jul. 17, 1998

Related U.S. Application Data

[60] Provisional application No. 60/063,221, Oct. 23, 1997.

[51] Int. Cl.⁷ ...................................................... H05K 9/00
[52] U.S. Cl. ........................ 307/91; 307/89; 324/207.21; 323/294; 323/368; 257/508; 257/659; 257/660; 257/662
[58] Field of Search ............................... 307/91, 89, 401; 338/32 H; 360/46, 113; 335/215; 324/207.21, 252; 330/62; 365/8, 158; 323/294, 368; 257/508, 660, 662, 659

[56] References Cited

U.S. PATENT DOCUMENTS

| | | | |
|---|---|---|---|
| 3,537,022 | 10/1970 | Regan | 330/10 |
| 5,041,780 | 8/1991 | Rippel | 338/32 H |
| 5,270,882 | 12/1993 | Jove et al. | 360/46 |
| 5,539,598 | 7/1996 | Denison et al. | 360/113 |

FOREIGN PATENT DOCUMENTS

| | | |
|---|---|---|
| 0586062A | 3/1994 | European Pat. Off. . |
| 58215833A | 3/1984 | Japan . |
| WO 95/20768 | 8/1995 | WIPO . |
| WO 98/37672 | 8/1998 | WIPO . |

*Primary Examiner*—Albert W. Paladini
*Attorney, Agent, or Firm*—Wolf, Greenfield & Sacks, P.C.

[57] ABSTRACT

An isolator having a driver circuit which responsive to an input signal drives appropriate signals into one or more coils which are magnetically coupled to one or more corresponding MR or GMR elements whose resistance is variable in response to the magnetic field applied by the coil(s), and an output circuit that converts the resistance changes to an output signal corresponding to the input signal. A Faraday shield is interposed between the coil(s) and the MR or GMR elements. Common mode transients applied to the driver are capacitively coupled from the coil(s) into the Faraday shield and therethrough to ground, instead of into the MR elements. A second Faraday shield may be disposed in spaced relationship with the first Faraday shield and referenced to the potential of the MR elements for even greater common mode rejection. The entire structure may be formed monolithically as an integrated circuit on a single substrate, for low cost, small size, and low power consumption. With proper driver and receiver circuits, the isolator may transmit either analog or digital signals.

14 Claims, 4 Drawing Sheets

MAGNETICALLY COUPLED SIGNAL ISOLATOR USING A FARADAY SHIELDED MR OR GMR RECEIVING ELEMENT

RELATED APPLICATION

This application claims priority to Provisional Application Ser. No. 60/063,221, filed Oct. 23, 1997, and entitled: "Magnetically Coupled Signal Isolator Using a Faraday Shielded MR or GMR Receiving Element", the entire contents of which are incorporated herein by reference.

FIELD OF THE INVENTION

This invention relates to the field of circuitry for isolating analog and digital electronic signals, such as to provide galvanic isolation between signal sources in a process control system and amplifiers or microcontrollers receiving signals from those sources, or between microcontrollers and other signal sources and transducers or other devices using those signals.

BACKGROUND OF THE INVENTION

In a variety of environments, such as in process control systems, analog or digital signals must be transmitted between diverse sources and circuitry using those signals, while maintaining electrical (i.e., galvanic) isolation between the sources and the using circuitry. Isolation may be needed, for example, between analog sensors and amplifiers or other circuits which process their output, or between microcontrollers, on the one hand, and sensors or transducers which generate or use microcontroller input or output signals, on the other hand. Electrical isolation is intended, inter alia, to prevent extraneous transient signals, including common-mode transients, from inadvertently being processed as status or control information, or to protect equipment from shock hazards or to permit the equipment on each side of an isolation barrier to be operated at a different supply voltage, among other known objectives. One well-known method for achieving such isolation is to use optical isolators that convert input electrical signals to light levels or pulses generated by light emitting diodes (LEDs), and then to receive and convert the light signals back into electrical signals. Optical isolators present certain limitations, however: among other limitations, they are rather non-linear and not suitable for accurate linear applications, they require significant space on a card or circuit board, they draw a large current, they do not operate well at high frequencies, and they are very inefficient. They also provide somewhat limited levels of isolation. To achieve greater isolation, opto-electronic isolators have been made with some attempts at providing an electrostatic shield between the optical transmitter and the optical receiver. However, a conductive shield which provides a significant degree of isolation is not sufficiently transparent for use in this application.

One isolation amplifier avoiding the use of such optical couplers in a digital signaling environment is described in U.S. Pat. No. 4,748,419 to Somerville. In that patent, an input data signal is differentiated to create a pair of differential signals that are each transmitted across high voltage capacitors to create differentiated spike signals for the differential input pair. Circuitry on the other side of the capacitive barrier has a differential amplifier, a pair of converters for comparing the amplified signal against high and low thresholds, and a set/reset flip-flop to restore the spikes created by the capacitors into a logic signal. In such a capacitively-coupled device, however, during a common mode transient event, the capacitors couple high, common-mode energy into the receiving circuit. As the rate of voltage change increases in that common-mode event, the current injected into the receiver increases. This current potentially can damage the receiving circuit and can trigger a faulty detection. Such capacitively coupled circuitry thus couples signals that should be rejected. The patent also mentions, without elaboration, that a transformer with a short R/L time constant can provide an isolation barrier, but such a differential approach is nonetheless undesirable because any mismatch in the non-magnetic (i.e., capacitive) coupling of the windings would cause a common-mode signal to appear as a difference signal.

Another logic isolator which avoids use of optical coupling is shown in commonly-owned, unpublished U.S. patent application Ser. No. 08/805,075, filed Feb. 21, 1997, in the name of Geoffrey T. Haigh, titled "Logic Isolator with High Transient Immunity," incorporated by reference herein. This logic isolator exhibits high transient immunity, for isolating digital logic signals, such as signals between equipment on a field side (i.e., interfacing with physical elements which measure or control processes) and microcontrollers on a system control side, useful in, for example, a process control system. In one aspect, the logic isolator has an input circuit that receives a digital input signal, with edge detection circuitry that detects rising and falling edges of that input signal. The logic circuit provides an output signal indicative of those rising and falling edges to a transformer assembly which serves as an isolation barrier. The transformer assembly replicates the signal it receives and provides it to an output circuit, while shunting capacitive common-mode transient currents to ground. The output circuit converts the signal from the transformer back into a digital logic signal with rising and falling edges as in the digital input signal, those slightly delayed therefrom. The transformer assembly preferably includes a link-coupled transformer that has a first core with a first winding, a second core with a second winding, and a grounded link wire that extends from the first core to the second core for grounding capacitively-linked common-mode transients. Alternatively, a shielded transformer, with a grounded double-or single-shield between primary and secondary windings, could be used.

In certain described embodiments, the input circuit converts the rising and falling edges in the digital input signal to positive and negative pulses using tri-level logic, and the output circuit converts these pulses back into rising and falling edges. The input circuit preferably also includes a pulse generator for providing pulses, referred to as refresh pulses, with a high frequency and with a pulse width that is the same as the width of the pulses created in response to detection of a rising edge or a falling edge. The refresh pulses are logically combined with the input signal to provide an interrogating functionality that allows the isolator to determine the DC-or steady-state of the input signal; therefore, the isolator can recover quickly in case of a power spike or dropout, and also can quickly determine the state if an edge is missed. The isolator has circuitry that inhibits the first refresh pulse after an edge to prevent a double-wide pulse being transmitted; consequently, the isolator can interrogate the state of the input signal a time t after an event, with T<t<2T–i.e., no later than 10 µs if the refresh pulses have a period of 5 µs.

A need, however, exists for an isolation technology which is useful for both analog and digital signals. A further need exists for isolators which are manufacturable with still lower cost than the aforementioned types of isolators, operating at lower power and manufacturable in very small size. Even more specifically, a need exists for isolators employing magneto-resistive (MR) and giant magneto-resistive (GMR) effects and which are very fast in operation (being useful in the nanosecond domain).

SUMMARY OF THE INVENTION

The present invention addresses these needs by providing an isolator wherein an input signal is coupled from an input node to a magnetic-field generator and the magnetic field generated thereby is coupled to one or more corresponding MR or GMR elements whose resistance is variable in response to the magnetic field, with an output circuit that converts the resistance changes to an output signal corresponding to the input signal. A Faraday shield is interposed between the coil(s) and the MR or GMR elements. (Hereafter, the term MR will be used generically, except where otherwise noted from context, to include both magneto-resistive and giant magneto-resistive elements.) The input signal is referenced to a first ground, or reference potential, and the output signal is referenced to a second ground, or reference potential. Common mode transients are capacitively coupled from the coil(s) into the Faraday shield and therethrough to the second ground, instead of into the MR elements. The magnetic-field generator may include one or more coils and a driving circuit coupled between the input node and the coil or coils.

According to an aspect of the invention, two Faraday shields may be disposed in spaced relationship between the coil(s) and the MR elements. In such an arrangement, a first Faraday shield is at the first reference potential and the second Faraday shield is at the second reference potential.

According to certain aspects of the invention, the MR elements comprise four magnetically-sensitive resistors elements arranged in a bridge, with diagonally opposing pairs of such resistors receiving the magnetic field from each of first and second input coils, respectively. The output nodes of the bridge are connected to differential inputs of a differential receiver.

In one aspect, an isolator according to the invention may be monolithically fabricated. Either one die or two may be used. With two die, the driver circuitry may, for example, be formed on a first substrate and the coil(s), MR element(s) and receiver may be formed on a second substrate. An embodiment is shown with a complete isolator formed monolithically on a single die.

With appropriate driver and receiver circuits, the isolator is useful for either analog signals or digital signals. Exemplary driver and receiver circuits for each type of signal are shown.

The foregoing and other features, advantages and alternative embodiments of the invention, will be more readily understood and become apparent from the detail description which follows, which should be read in conjunction with the accompanying drawings and claims. The detailed description will be understood to be exemplary only and is not intended to be limited of the invention.

DETAILED DESCRIPTION

Figure 1:
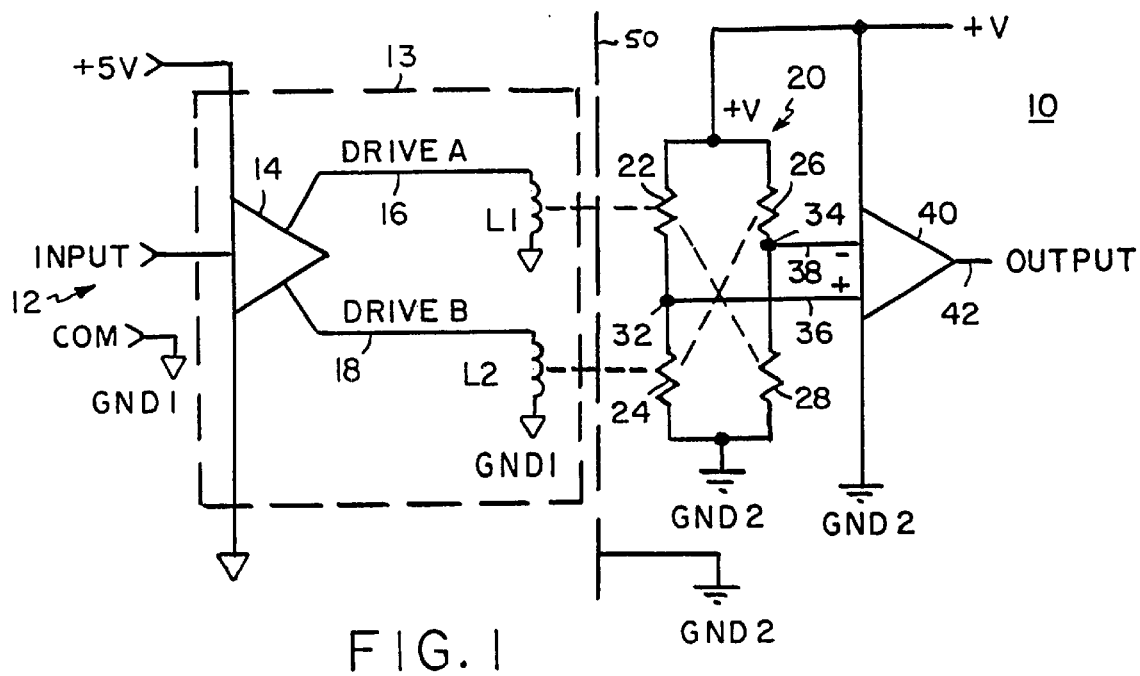
FIG. 1 is a schematic circuit diagram for a first exemplary implementation of an isolator according to the present invention.

An exemplary implementation of an MR isolator 10 in accordance with the present invention is illustrated schematically in FIG. 1. An input voltage is supplied at port 12 to a magnetic field generator 13, comprising an input driver 14 and one or more coils L1, L2. Driver 14 supplies output signals DRIVE A and DRIVE B on lines 16 and 18, respectively, to respective coils L1 and L2. Each of coils L1 and L2 generates a magnetic field which is sensed by a bridge 20 formed by MR elements 22, 24, 26 and 28. Elements 22 and 24 are connected in series across the supply rails as are elements 26 and 28. The bridge provides a differential output across nodes 32 and 34 at the respective junctions between resistors 22 and 24 on the one hand, and 26 and 28 on the other. Node 32 supplies a first signal RCVDC on line 36 to a non-inverting input of a differential receiver 40 and node 34 supplies a second received signal RCVDD on line 38 to the inverting input of the receiver 40. The output of the isolator appears on line 42 at the output of receiver 40. Since galvanic isolation of the output from the input is a principal objective, the input is referenced to a first ground, GND1, and the ouput is referenced to a second ground, GND2. A Faraday shield, connected to ground GND2, is interposed between the coils L1, L2, on the one hand, and bridge 20, on the other. Faraday shield 50 provides electrostatic isolation between the coils and the MR bridge while allowing the magnetic fields generated by the coils to pass through to the MR elements of the bridge. Specifically, the field generated by coil L1 passes through elements 22 and 28 while the field generated by coil L2 passes through the elements 24 and 26.

For use as an analog signal isolator, the driver 14 may typically provide signals DRIVEA and DRIVEB as a pair of differential output signals. Some wave-shaping or signal conditioning may be applied in driver 14 or in receiver 40, as appropriate to the applications.

Figure 2:
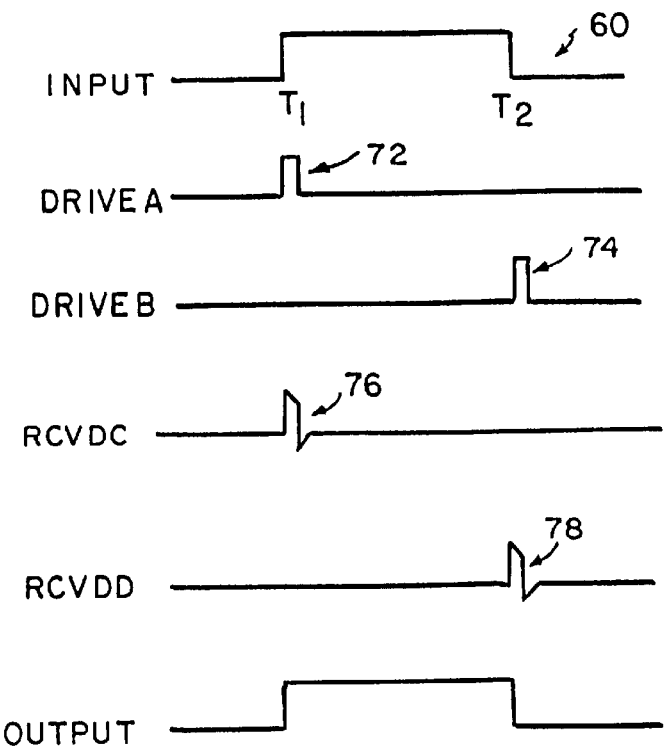
FIG. 2 is a waveform diagram illustrating operation of the circuit of FIG. 1 as a digital signal isolator.

For use as a digital signal isolator, operation of isolator 10 circuit may be understood with reference to the waveforms of FIG. 2. In FIG. 2, it is assumed that the input signal is a voltage having a waveform representing a logic signal illustrated at 60. Prior to time $T_1$, signal 60 is low. At time $T_1$, the input goes from a low to a high value and driver 14 presents a pulse 72 of a short, predetermined width and amplitude in the signal DRIVEA. At the falling edge of the input signal, at time $T_2$, a comparable pulse 74 is generated by driver 14 in the signal DRIVEB. The corresponding received signals detected at nodes 32 and 34 are shown in the waveforms for the signals RCVDC and RCVDD. The receiver 40 is a comparator with a slight amount of hysteresis, which essentially operates as a bistable element. The "pulse" 76 generated in the RCVDC signal by DRIVEA pulse 72 sets the output signal high, and the pulse 78 generated in the RCVDD signal generated by the DRIVEB pulse 74 resets the output signal to a low level. Thus, the output signal recreates the input signal faithfully.

The amount of hysteresis employed in receiver 40 preferably is selected to assure a high reliability of set and reset operation of the receiver while obtaining as much insensitivity to noise as possible.

Figure 3:
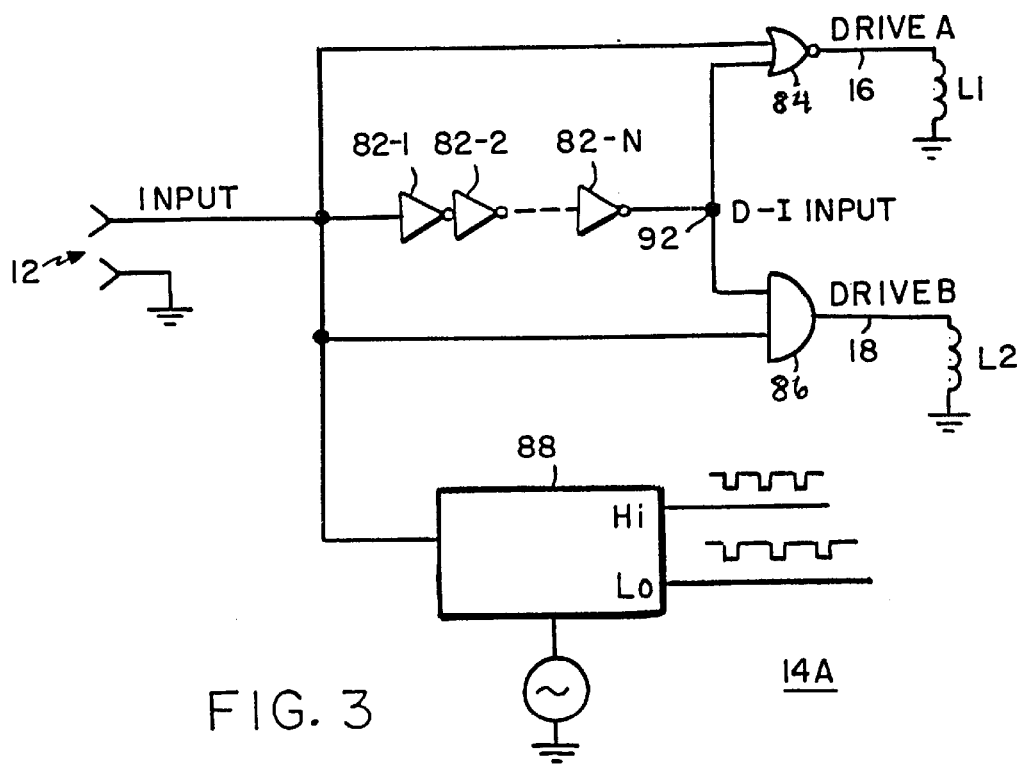
FIG. 3 is a logic diagram for a driver circuit suitable for use in the digital isolator of FIG. 2.

While numerous circuits may be employed for driver 14 in the digital signal processing mode, an exemplary circuit 14A is shown in FIG. 3. The input signal applied to port 12 is supplied to an odd number of inverters 82-1 through 82-N (three inverters may suffice), as well as to one input of each of NOR-gate 84 and AND gate 86, as well as to pulse generator 88. (Pulse generator 88 is optional and its use is described adequately in the aforementioned patent application of Geoffrey Haigh.) A second input of each of gates 84 and 86 is supplied from the output of the inverter string 82-1 through 82-N. The output of NOR-gate 84 supplies the DRIVEA signal on line 16 to coil L1 and the output of AND GATE 86 supplies the DRIVEB signal on line 18 to coil L2.

Figure 4:
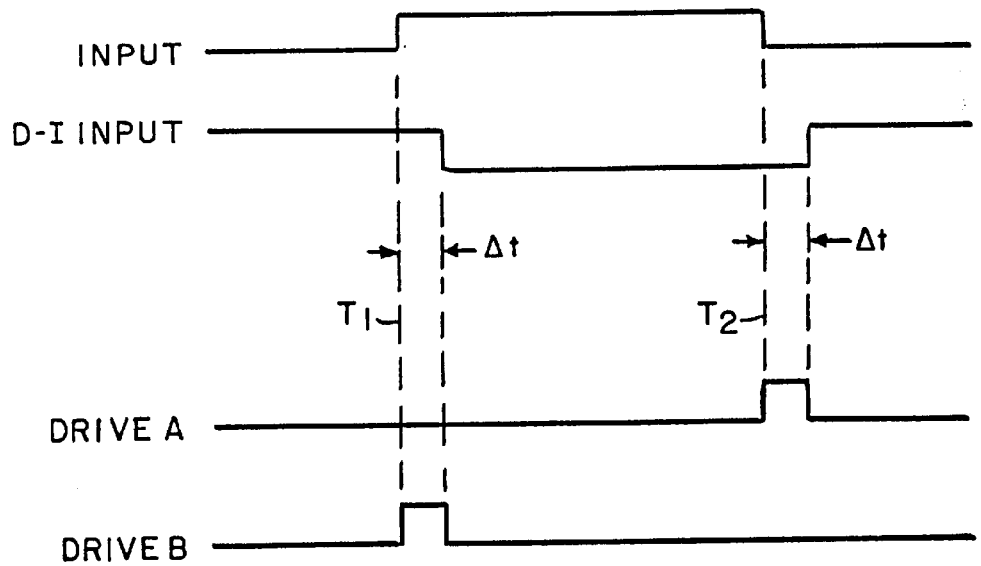
FIG. 4 is a waveform diagram illustrating operation of the circuit of FIG. 3.

The operation of the circuit of FIG. 3 is now explained with reference to the waveforms of FIG. 4. The input signal again is assumed to be a logic signal which is high between times $T_1$ and $T_2$. The delayed and inverted state of the input signal which appears at node 92, termed D-I INPUT, thus is a copy of the input signal, inverted and delayed by the propagation delay of the inverter chain 82-1 through 82-N, which delay is labeled in the drawing as $\Delta t$. It is assumed that $\Delta t$ is much smaller than the interval from $T_1$ through $T_2$. For example, $\Delta t$ is typically just a few nanoseconds. The output from NOR-gate 84 consequently is high except during interval from $T_2$ to $T_2+\Delta t$; and the output of the AND gate 86, the DRIVEB signal, is high except in the interval from $T_1$ to $T_1+\Delta t$.

Figure 5:
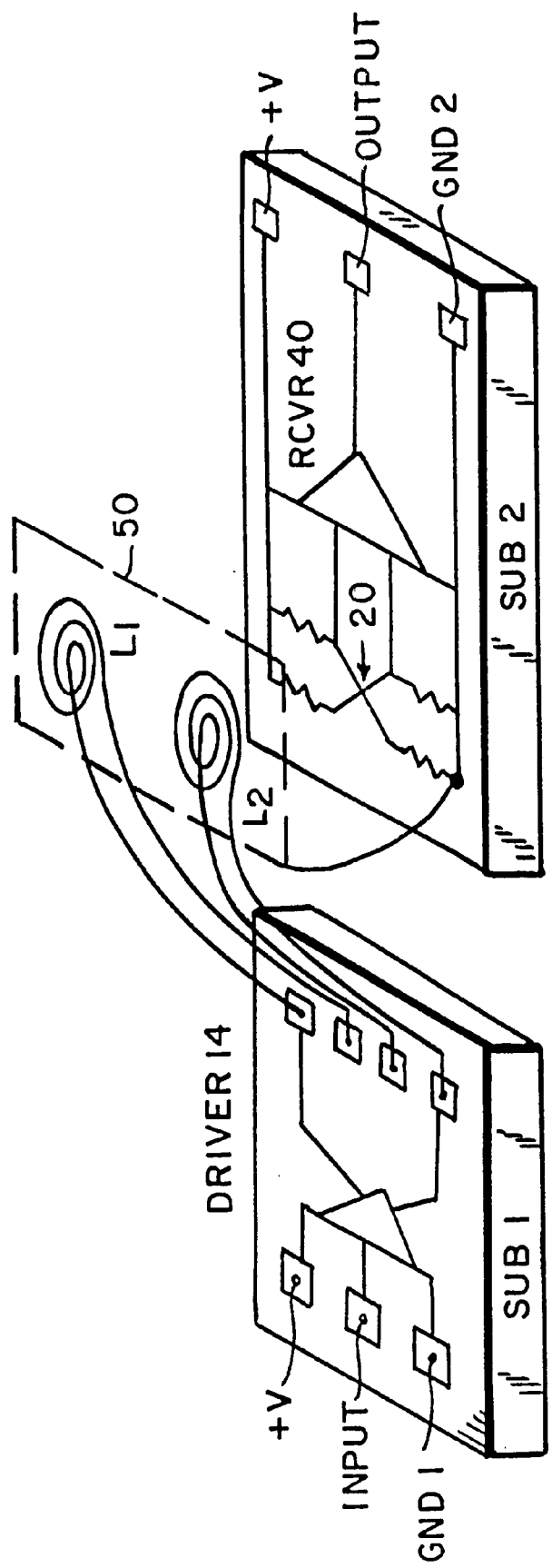
FIG. 5 is a diagrammatic, exploded view showing conceptually how an isolator according to the present invention may be fabricated using integrated circuit manufacturing techniques.

A diagrammatic illustration, as shown in FIG. 5, is useful to illustrate conceptually how such an isolator may be fabricated monolithically. Such fabrication may occur with the driver on a first substrate, SUB1, and with the coils, Faraday shield, MR sensor and receiver on a second substrate, SUB2, or with the entire apparatus on a single substrate (ie., where SUB1 and SUB2 are the same substrate), as more fully explained below.

Figure 6:
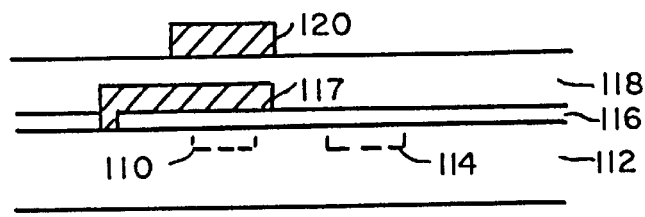
FIG. 6 illustrates in a simplified side view, schematically, the layers of materials that form monolithically the elements of an isolator according to the present invention.

Without indicating any patterning, FIG. 6 shows a schematic side view of the layers of materials that form monolithically the coils, Faraday shield, sensor and receiver of FIG. 5. The resistive sensors 110 are formed on or in a semiconductor substrate 112 along with the receiver circuitry indicated generally in area 114. A thin layer of oxide 116 is then formed over the substrate. This is followed by a metallization layer which connects to the substrate (i.e., the input's ground) and which provides the Faraday shield; appropriate positioning and area considerations are discussed below). A thick oxide layer 118 is applied over the metallization. On top of the thick oxide layer 118 there is formed a metallization layer 120 which is patterned to form coil L1 and L2 in appropriate geometric relationship and placement over sensor elements 110.

Figure 7:
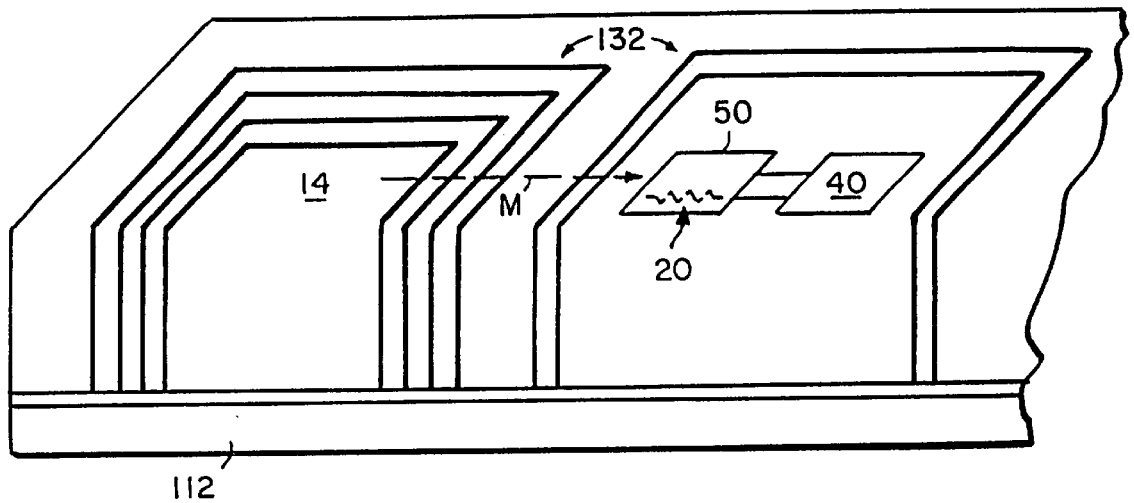
FIG. 7 is a simplified diagrammatic, isometric view, partially in cross section, showing how a complete isolator according to the present invention, with an input driver circuit, may be fabricated monolithically on a single substrate.

Turning to FIG. 7 there is generally illustrated a single substrate embodiment containing the entire isolator. The driver circuitry 14 is electrically isolated from the sensors 20 and receiving circuitry 40 by building the entire isolator structure on an oxide layer formed over the substrate 112 and then surrounding the driver and/or sensors and receiver by one or more dielectric isolation zones, also called trenches, 132 which are filled during fabrication with an oxide or other dielectric material. To avoid obfuscation, the coils are not drawn but are represented operatively by the dashed line M, representing a magnetic linking.

Using a trench-isolated IC manufacturing process, approximately one kilovolt of isolation is provided per micrometer of oxide (or nitride or similar dielectric) thickness. With a base oxide layer and trenches three micrometers thick, approximately three kilovolts of isolation will be achieved. This is satisfactory for a large number of typical applications and it can be increased for other applications.

Figure 8:
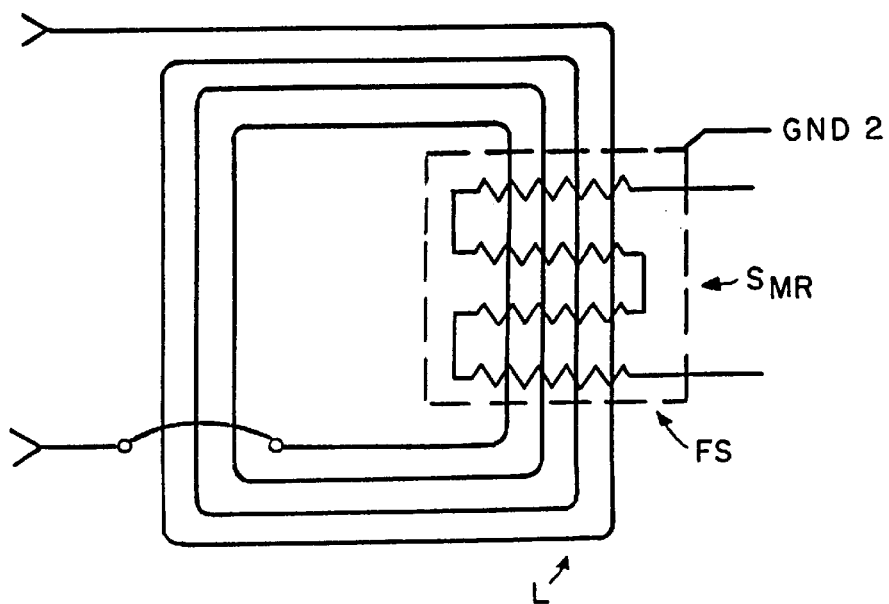
FIG. 8 is a simplified top view of a portion of an exemplary isolator according to the invention, showing the spatial relationship among the magnetic-field generating coil(s), a Faraday shield and magnetoresisitive sensor elements.

A top view, in diagrammatic form, of an exemplary geometry for a single coil-shield-sensor arrangement is shown in FIG. 8. The Faraday shield FS which is interposed between the coil L and the sensor $S_{MR}$ is a highly conductive surface, such as a metal, which does not form a closed loop of high permeability "short circuiting" the magnetic field. Thus, a metal patch area over the sensor is sufficient, where the surface area of the metal patch does not span the whole coil. The orientation of the sensor resistors relative to the coil may be significant. MR and GMR resistors generally change their resistance in response to the applied magnetic field when the magnetic field lines are oriented longitudinally with the resistor. Thus, in the illustration, the MR resistors of sensor $S_{MR}$ are shown oriented horizontally while the coil windings are substantially vertical where they span the sensor.

A typical opto-isolator draws a steady current of about 3–15 mA for high speed digital operation, using a supply voltage in the three to five volt range. By contrast, the exemplary apparatus of FIG. 2 et seq. draws very little current except during the drive pulses. With a 50MHz clock speed and a pulse width, $\Delta t$, of one nanosecond, if the current drawn during the pulse is 10 mA, the average current is only 0.5 mA. At low clock speeds or data rates such as a 50 Hz rate as might be used in medical electronics, for example, the drive pulses consume an average current of only about 0.5 microamps. Even considering the current required for operating the receiver and quiescent driver circuits, the entire apparatus may be operated on only about 10–12 microamps. Additionally, magnetoresistive elements are very fast to respond to changes in magnetic field, reacting in the nanosecond domain. As a result, an isolator in accordance with the invention should be much faster (e.g., ten times faster) than an opto-isolator.

For GMR elements, the change in resistance over the range of magnetic field from a zero field to a saturation field is only about 1–4 percent. When a five volt power supply is used, this means the GMR elements produce only about a 50–200 millivolt signal swing. The capacitive coupling between the coils and the GMR elements may be about 0.1–1 pF without the Faraday shield. If a transient common mode voltage is imposed on driver 14, it is capacitively coupled from the output of drive 14 into Faraday shield 50, and the capacitive current is coupled to ground.

Numerous design considerations must be taken into account when assembling such an isolator, in addition to those already discussed. These are easily within the skill of circuit design and semiconductor engineers. For example, the MR elements must be placed relative to the magnetic field provided by the coils so as, preferably, to have the magnetic field direction coincide substantially with the sensors' lengthwise, most-sensitive, direction. The MR elements will thus generate the greatest output for a given magnetic field if they (the MR elements) are all similarly oriented relative to the magnetic field. A useful arrangement, as depicted in top view in FIG. 8 is to form the coils as about six substantially rectangular turns of conductor, forming an inductance of about 1 nH, disposing the magneto-resistive elements under one side of the rectangle, with their magnetically-sensitive direction being transverse to the rectangle's side. (With such a small inductance, it is important that the driver circuit act as a very good current source.) The Faraday shield should be large enough to span the MR elements but not so large as to have it interfere significantly with the magnetic field from the coils cutting through the MR elements.

Having thus described the invention and various illustrative embodiments of the invention, some of its advantages and optional features, it will be apparent that such embodiments are presented by way of example only and not by way of limitation. Those persons skilled in the art will readily devise alterations and improvements on these embodiments, as well as additional embodiments, without departing from the spirit and scope of the invention. For example, it will be appreciated that although the MR sensor is shown as a bridge circuit in the illustrated embodiments, a single MR element or two MR elements might be employed, instead, and four elements might be arranged in a manner other than as a bridge. Likewise, though two coils are shown as the magnetic field generation members, one might choose to use just one coil, or some other number than two, with appropriate driver circuitry. The driver circuit is not needed in all cases, as the input signal source may be able to drive the coils directly. Alternatively, some other magnetic-field generating apparatus may be employed. It is impossible to enumerate all of the variations that will quite quickly occur to those in the art. Accordingly, the invention is limited only as defined in the following claims and equivalents thereto.

What is claimed is:

1. A signal isolator comprising:
   a. an input node for receiving an input signal;
   b. at least one magnetic-field generation member actuable to generate a magnetic field corresponding to the input signal;
   c. a magnetoresistive sensor positioned to receive and be influenced by the magnetic field generated by the at least one magnetic field generation member such that the sensor supplies at an output node a signal corresponding to the magnetic field; and
   d. a Faraday shield disposed between the at least one magnetic-field generation member and the sensor, said shield being electrically referenced to a same potential as the output node, said referenced potential being galvanically isolated from a potential to which the input node is referenced.

2. The isolator of claim 1 wherein the magnetic-field generation member includes at least one coil which generates said magnetic field.

3. A signal isolator, comprising:
   a. an input node for receiving an input signal;
   b. at least one magnetic-field generation member actuable to generate a magnetic field corresponding to the input signal;
   c. a magnetoresistive sensor positioned to receive and be influenced by the magnetic field generated by the at least one magnetic field generation member, such that the sensor supplies at an output node a signal corresponding to the magnetic field; and
   d. a Faraday shield disposed between the at least one magnetic-field generation member and the sensor, said shield being electrically referenced to a same potential as the output node;
   wherein the magnetic-field generation member includes at least one coil which generates said magnetic field and a driver circuit coupled between the input node and the at least one coil and driving the at least one coil.

4. The isolator of claim 3 wherein the input signal is a digital signal, the at least one coil includes first and second coils, and the driver circuit drives the first and second coils with short pulses of current in response to logic value changes in the input signal.

5. The isolator of any of claims 3–4 further including a receiver circuit coupled to the sensor and supplying an output signal at an output thereof.

6. The isolator of claim 5 wherein the isolator is formed on a single semiconductor substrate.

7. The isolator of any of claims 3–4 wherein the isolator is formed on a single semiconductor substrate.

8. A signal isolator, comprising:
   a. an input node for receiving an input signal;
   b. at least one magnetic-field generation member actuable to generate a magnetic field corresponding to the input signal;
   c. a magnetoresistive sensor positioned to receive and be influenced by the magnetic field generated by the at least one magnetic field generation member, such that the sensor supplies at an output node a signal corresponding to the magnetic field;
   d. a Faraday shield disposed between the at least one magnetic-field generation member and the sensor, said shield being electrically referenced to a same potential as the output node; and
   e. a receiver circuit coupled to the sensor and supplying an output signal at an output thereof;
   wherein the magnetic-field generation member includes at least one coil which generates said magnetic field.

9. The isolator of claim 8, wherein the isolator is formed on a single semiconductor substrate.

10. A signal isolator, comprising:
    a. an input node for receiving an input signal;
    b. at least one magnetic-field generation member actuable to generate a magnetic field corresponding to the input signal;
    c. a magnetoresistive sensor positioned to receive and be influenced by the magnetic field generated by the at least one magnetic field generation member, such that the sensor supplies at an output node a signal corresponding to the magnetic field; and
    d. a Faraday shield disposed between the at least one magnetic-field generation member and the sensor, said shield being electrically referenced to a same potential as the output node;
    wherein the magnetic-field generation member includes at least one coil which generates said magnetic field; and
    wherein the isolator is formed on a single semiconductor substrate.

11. A signal isolator, comprising:
    a. an input node for receiving an input signal;
    b. at least one magnetic-field generation member actuable to generate a magnetic field corresponding to the input signal;
    c. a magnetoresistive sensor positioned to receive and be influenced by the magnetic field generated by the at least one magnetic field generation member, such that the sensor supplies at an output node a signal corresponding to the magnetic field; and d. a Faraday shield disposed between the at least one magnetic-field generation member and the sensor, said shield being electrically referenced to a same potential as the output node; and e. a receiver circuit coupled to the sensor and supplying an output signal at an output thereof.

12. The isolator of claim 11, wherein the isolator is formed on a single semiconductor substrate.

13. A signal isolator, comprising:

a. an input node for receiving an input signal;

b. at least one magnetic-field generation member actuable to generate a magnetic field corresponding to the input signal;

c. a magnetoresistive sensor positioned to receive and be influenced by the magnetic field generated by the at least one magnetic field generation member, such that the sensor supplies at an output node a signal corresponding to the magnetic field; and d. a Faraday shield disposed between the at least one magnetic-field generation member and the sensor, said shield being electrically referenced to a same potential as the output node;

wherein the isolator is formed on a single semiconductor substrate.

14. An isolator according to any of claims 1, 2, 3, 4, 6 or 8–13, further comprising, in addition to said Faraday shield, which shall be called the first Faraday shield, a second Faraday shield electrically referenced to a same potential as the input node and disposed between the at least one magnetic-field generation member and the first Faraday shield, the potential to which the input node is referenced and the potential to which the output node is referenced being galvanically isolated from each other.

* * * * *